(12) United States Patent
Kraemer

(10) Patent No.: US 6,994,567 B2
(45) Date of Patent: Feb. 7, 2006

(54) TEST DEVICE FOR COMPONENTS OF INTEGRATED CIRCUITS

(75) Inventor: Josef Kraemer, Erding (DE)

(73) Assignee: Infineon Technologies AG, (DE)

( * ) Notice: Subject to any disclaimer, the term of this patent is extended or adjusted under 35 U.S.C. 154(b) by 0 days.

(21) Appl. No.: 11/026,541

(22) Filed: Jan. 3, 2005

(65) Prior Publication Data

US 2005/0130504 A1 Jun. 16, 2005

Related U.S. Application Data

(63) Continuation of application No. PCT/DE03/02161, filed on Jun. 30, 2003.

(30) Foreign Application Priority Data

Jul. 1, 2002 (DE) ............................... 102 29 541
Apr. 3, 2003 (DE) ............................... 103 15 436

(51) Int. Cl.
*H01R 12/00* (2006.01)

(52) U.S. Cl. ................. 439/70; 439/525; 439/862; 439/701; 439/331

(58) Field of Classification Search ............ 439/70–73, 439/83, 330, 525, 701, 862, 68
See application file for complete search history.

(56) References Cited

U.S. PATENT DOCUMENTS

| 4,199,209 A | * | 4/1980 | Cherian et al. ............ 439/591 |
| 4,871,316 A | * | 10/1989 | Herrell et al. ................ 439/66 |
| 5,076,798 A | | 12/1991 | Uratsuji |
| 5,427,536 A | | 6/1995 | Petersen et al. |
| 5,470,247 A | | 11/1995 | Fuchigami |
| 5,477,161 A | | 12/1995 | Kardos et al. |
| 5,545,045 A | * | 8/1996 | Wakamatsu .................. 439/70 |
| 6,123,552 A | * | 9/2000 | Sakata et al. ................. 439/71 |
| 6,293,814 B1 | | 9/2001 | Tan |
| 6,709,279 B2 | * | 3/2004 | Uratsuji ....................... 439/71 |
| 6,802,731 B2 | * | 10/2004 | Miura ........................ 439/266 |
| 2001/0012707 A1 | | 8/2001 | Ho et al. |

FOREIGN PATENT DOCUMENTS

| DE | 101 07 794 A1 | 8/2002 |
| EP | 0 622 982 A1 | 11/1994 |
| JP | 5-174923 | 7/1993 |
| JP | 11-185916 | 7/1999 |
| JP | 2001-6832 | 1/2001 |
| JP | 2001-183391 | 7/2001 |
| JP | 2002-164134 | 7/2002 |

* cited by examiner

*Primary Examiner*—Tho D. Ta
(74) *Attorney, Agent, or Firm*—Edell, Shapiro & Finnan, LLC

(57) ABSTRACT

A test device includes a test receptacle from which projects contact elements project and spring contacts that can be electrically contact-connected to the external contacts of an integrated circuit type. Corresponding to the external contact positions of the integrated circuit type, the test device includes module components having at least one electrically conductive contact plate and having an insulating carrier plate, the contact plate being incorporated in cutouts of the carrier plate and having a contact section, a spring section and a holding section.

30 Claims, 9 Drawing Sheets

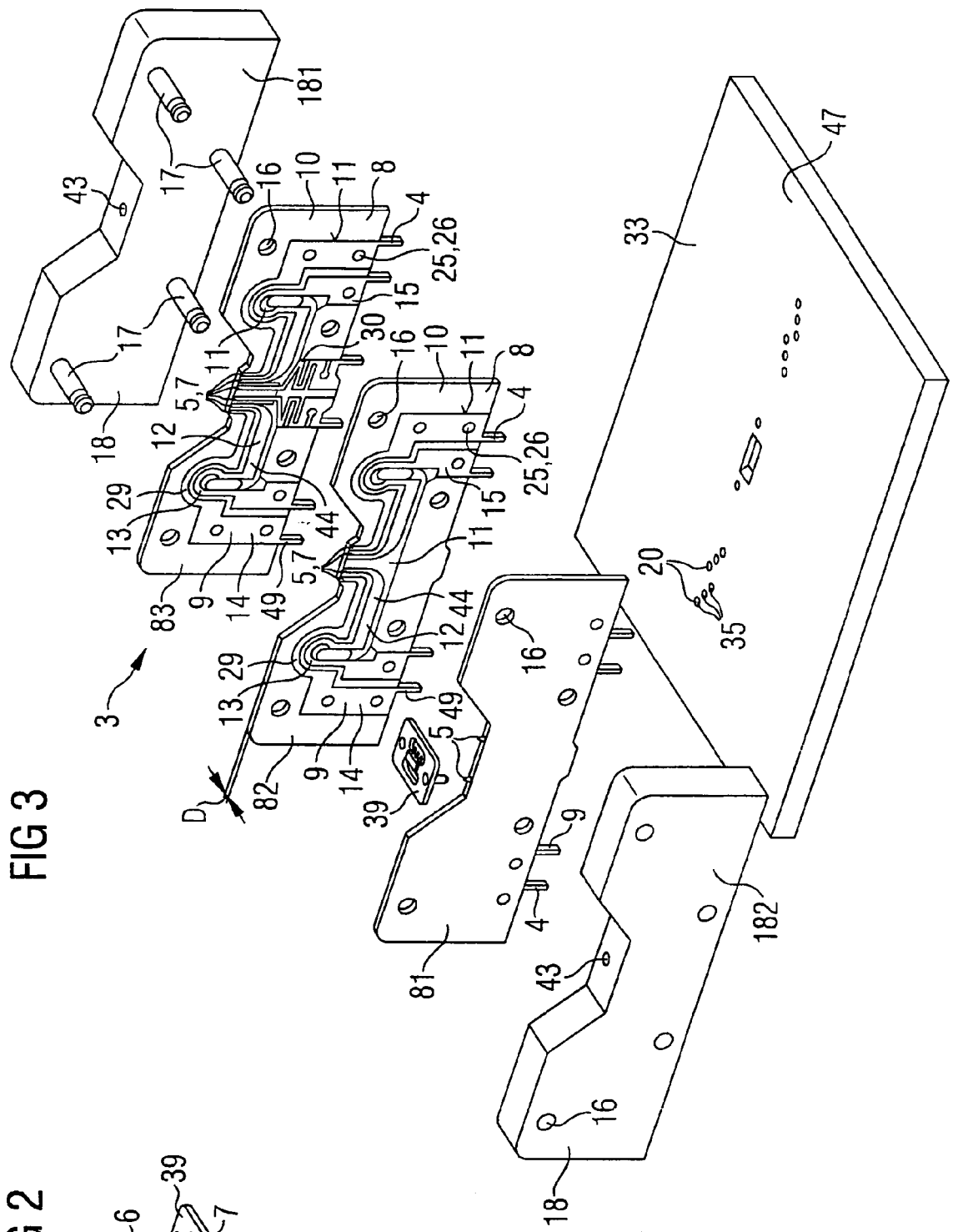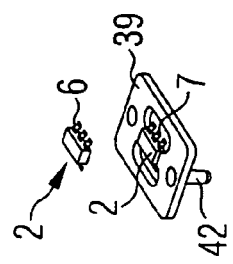

TEST DEVICE FOR COMPONENTS OF INTEGRATED CIRCUITS

CROSS REFERENCE TO RELATED APPLICATIONS

This application is a continuation of PCT/DE03/02161, filed Jun. 30, 2003, and titled "Test Device for Components of Integrated Circuits," which claims priority under 35 U.S.C. §119 to German Application No. DE 103 15 436.1, filed on Apr. 3, 2003, and to German Application No. DE 102 29 541.7, filed Jul. 1, 2002, the entire contents of which are hereby incorporated by reference.

FIELD OF THE INVENTION

The invention relates to a test device for components of integrated circuits.

BACKGROUND

Test devices for components of integrated circuits are necessary in order to be able to test the quality and functionality of the integrated circuits under extreme operating conditions after completion of the components. For this purpose, a matching potted test receptacle has heretofore been made available for each circuit type, which test receptacle cannot be adapted to small series because of its compactness. Consequently, for each new circuit type series, it is necessary to design a corresponding compact, fully potted test receptacle, the utility of which, particularly in the case of small series, is exhausted after a short time in service.

SUMMARY

The invention provides a test device with which it is possible to react flexibly to changes in the circuit type of the electronic components to reduce the test costs and to improve the reliability of the test results, particularly in the case of small series. The invention specifies a test device for components of integrated circuits, which test device has a test receptacle. Contact elements project from the test receptacle on its underside and are electrically connected to spring contacts projecting from the top side of the test receptacle. In this case, the spring contacts can be electrically contact-connected to external contacts of an integrated circuit type to be tested. In the case of the test device according to the invention, a module component having at least one electrically conductive contact plate and having an insulating carrier plate is provided for each external contact position of the circuit type.

The contact plate itself lies in a patterned cutout of the carrier plate. The contact plate is patterned and has essentially three sections, namely a contact section, a spring section and a holding section, the holding section in each case holding at least one of the contact elements projecting from the underside of the test receptacle. The totality of the module components forms the test receptacle for the predetermined integrated circuit type, for which purpose the module components are assembled to form a stack.

This test device has the advantage of a modular construction, with the result that it can be adapted to each different circuit type without having to cast a solid new test receptacle. Rather, the test receptacle can be variably adapted to the number of external contacts or external contact positions of the component to be tested and to the pitch of the external contacts of the component to be tested. For this purpose, as few as one module component may form the test receptacle or a number that is as high as desired may be stacked to form a test receptacle. What is crucial is that the contact plates can be arranged sufficiently close together that the smallest possible step sizes or pitches of terminal contacts of components with integrated circuits can be assembled. In this case, a step size in the range of about 1 mm down to about 0.3 mm is possible and is determined by the material thickness of the module component.

A further advantage of this construction is that the contact plates are carried by the carrier plates and can thus neither tilt nor flex, especially as the patterned contact plate is arranged in a correspondingly preformed and patterned cutout of the carrier plate. Furthermore, the modular design has the advantage that shorter signal paths are achieved aas result of additional adapter printed circuit boards being omitted. This also reduces the line impedance with regard to inductances and capacitances. Due to the omission of such adapter printed circuit boards of the kind required for potted test receptacles, it is also possible to achieve higher supply currents during use of the test device according to the invention, which may be far greater than 20 amperes in the case of the test device according to the invention.

Embodiments of the individual sections of the patterned contact plate, their characteristics and their advantages will now be described below.

The spring contacts of the contact plate may have, in the region of the contact sections of the contact plate, an oxidation or erosion-resistant coating composed of a noble metal, preferably composed of gold, especially since gold has the lowest contact resistance and the longest contact lifetime since neither oxidation nor sulfidation in air take place. The contact elements on the underside of the test receptacle may also be protected against corrosion, oxidation or sulfidation with coatings of this type. The contact plate itself may comprise a spring bronze such as beryllium bronze, which enables a longer lifetime of the spring contacts on account of its elastic properties.

In one embodiment of the invention, the module component may have, for each external contact, two contact plates—arranged in a manner insulated from one another in two cutouts—with, in each case, two spring contacts, which are connected to an individual external contact during testing. From these two patterned contact plates, two contact elements are arranged on the underside of the test receptacle, which contact elements are connected to the two associated spring contacts in a manner electrically insulated from one another, one contact plate, via its spring contact, applying a test signal to the external contact of the component to be tested, while the other contact plate with its spring contact ensuring that the test signal is present at the external contact. This structure has the advantage that, during the test operation, the presence of the test signals is ensured metrologically by the respective second spring contact of a contact plate pair, thereby improving the reliability of the test results.

The at least one contact plate also has a spring section in addition to the contact section. The spring section may be realized by a spiral spring arc which adjoins the contact section of the contact plate and the spring forces of which are likewise taken up by the holding section of the contact plate. For this purpose, both the contact section and the spring section of the contact plate are incorporated in the patterned cutout of the carrier plate with a clearance fit which has 0.2 to 0.3 mm in order to permit a corresponding contact spring deflection of the contact section and thus of the spring contact.

A spring clasp may also be provided instead of the spiral spring arc. Such a spring clasp has the advantage that it can be provided more compactly with a smaller space requirement on the cutouts of the carrier plate. Instead of a clasp or an individual spiral arc, the spring section may also have an S-shaped spring element which springs back more softly than a spring clasp and thus has a smaller spring constant.

Toward the underside of the test receptacle, the holding section is adjoined by at least one contact element projecting from the test receptacle per contact plate. The contact element may either be produced rigidly by a test pin or be realized elastically by a contact spring connected to the holding section. If the contact element projecting from the underside is produced by a contact spring, then the latter may act on a test board directly by virtue of its spring contact. For this purpose, the spring contacts may be formed on the underside of the test receptacle as a spreading spring and be spread away spring-elastically from the holding section of the contact plate. The spring pressure of such a spreading spring can be adapted to the requirements of a test receptacle by means of the length of the spring arm and by means of the cross section of the spreading spring material. One advantage of this arrangement is that the signal paths from the test board through the contact spring to the spring contacts projecting on the top side of the test receptacle are very short, so that the line impedance comprising inductances and capacitances is reduced.

In the case of a spring-elastic connection between test board and contact spring, however, there is no spacing between the test board and the underside of the test receptacle. Such a spacing can be realized with rigid test pins, however, so that it can be ensured that the test board can be thermally decoupled from the underside of the test receptacle that is exposed to the test temperatures in the test device.

For this purpose, each contact plate has a rigid contact element projecting from the underside as a test pin. For receiving cylindrical test pins projecting from the test receptacle, the test device has a test board with plug sockets. The test board may be arranged at a distance from the underside of the test receptacle, this distance being bridged by the cylindrical test pins. The test sockets, analogously to the arrangement of the cylindrical test pins, have a corresponding arrangement in the test board, so that at least one plug socket is present in the test board for each module component.

Since the module component may also have spring contacts arranged in pairs, it is also possible for a plurality of test pins to project from an individual module component. On the basis of the central concept according to the invention, it is no problem to accommodate six or more spring contacts arranged parallel on a module component. An embodiment with six spring contacts on a module component will be explained in more detail later with the aid of corresponding figures.

While the holding section of the contact plate has a plurality of rigid contact elements that project as square pins from the underside of the test receptacle, the spacing between the underside of the test receptacle and a test board can be attained by cylindrical test pins that can be plugged onto the square pins in a force-locking manner. Consequently, the square pins, which are produced from the material and with the material thickness of the holding section, can be lengthened as desired by the cylindrical test pins.

The contact elements of the individual module components which are held by the holding sections of the contact plate and project from the test receptacle are arranged offset with respect to one another. This offset arrangement enables a greater breakdown dielectric strength of the test receptacle, in particular of the contact elements. This breakdown strength for the contact elements arranged offset with respect to one another is intended not to fall below 1 kV. In this case, the cross section of the contact elements is adapted to the cross section of the spring contacts which can be contact-connected to the external contacts of a component to be tested. In order to avoid overloading of the contact elements, the cross section of the contact elements may be between about 10% and 30% greater than the cross section of the spring contacts.

On the underside of the test receptacle, the contact elements, insofar as they are formed as contact springs, may be directly electrically connected to a rewiring structure for a test board or on a test board. As previously mentioned, this shortens the signal paths and thus reduces the line impedance. Rigid contact elements in the form of cylindrical test pins can also be connected to the rewiring pattern of a test board by providing plug sockets on the test board, which, for their part, are electrically connected to the rewiring pattern.

Each module component of the present invention has a material thickness of between approximately 0.3 mm and 1 mm. With this material thickness, spring contacts that lie close to one another are realized on the test receptacle and it is thus possible to test a component with an extremely low step size of the external contacts with the aid of the test device according to the invention. In order to achieve this material thickness of the module components, the carrier plate also has an overall material thickness of the same order of magnitude, namely of about 0.3 mm to 1 mm. Furthermore, the carrier plate has a minimum material thickness in the region of the cutouts in which the contact plate is to be accommodated. For these regions, the carrier plate has a minimum material thickness of $\geq 0.05$ mm.

The minimum value of the material thickness of the carrier plate is essentially determined by the insulation resistance that is to be achieved by the carrier plate. Therefore, the carrier plate material comprises polyimide, polyethylene, polystyrene, polytetrafluoroethylene or an epoxy resin. Such plastics may be reinforced by ceramic fibers or glass fibers in order to realize the stability of the carrier plate. The material thickness of the contact plate accommodated in the cutouts of the insulation plate has a value of about 0.05 to 0.750 mm and is adapted to the depth of the corresponding cutouts.

In order to secure the position of the holding section of the contact plate in the cutouts of the carrier plate, the contact plate may have, in the region of the holding section, a fitting opening into which an adapted projection of the carrier plate engages. The adapted projection may have the full thickness of the carrier plate and thus prevent the holding section of the contact plate from shifting relative to the carrier plate. This fixing of the contact plate in the region of the holding section is crucial because the holding section simultaneously holds the contact element and thus takes up the forces to be applied when a test pin is introduced into the plug sockets of the test board or the forces to be applied when contact springs are pressed onto the test board.

Instead of a fitting opening in the region of the holding section of the contact plate, the contact plate may also have, in the holding section, an arresting lug which engages into an adapted cutout of the carrier plate. Such an arresting lug has the advantage that it does not weaken the cross section of the holding section in the manner that might be affected by a fitting opening. In order that the arresting lug ensures that the contact-connecting forces for the contact elements are absorbed by the holding section, the arresting lug is arranged with an accurate fit parallel to the underside of the test receptacle in the adapted cutout of the carrier plate.

To achieve a precise stacking of the module components one on the other, each module component has at least two fitting openings through which lead centering bolts that connect two end pieces to one another. The end pieces are adapted area-congruently to the module components and can press together the stack comprising module components to form a test receptacle. For this purpose, corresponding fitting holes are also provided in the end pieces, the guide or centering bolts penetrating through the fitting holes. Consequently, when the end pieces are applied to the module components, the result is an exactly positioned stack comprising module components between the end pieces, which realizes the test receptacle for the test device according to the invention. For this purpose, one of the corner pieces may be fixedly connected to the centering bolts, while the second corner piece holds the module components in position by screw connections.

In order to securely position and press against the component to be tested during individual preliminary tests of a test receptacle, the end pieces may carry a frame which has a pivoting device. The pivoting device for individual preliminary tests of a test receptacle can be pivoted onto a component to be tested with an integrated circuit with spring contact-making between the external contacts of the component to be tested and the spring contacts of the module components of the test receptacle. The pivoting device has an insert that is adapted to the contour of the component to be tested and, in a locking position of the test device, presses the component with its external contacts onto the spring contacts of the test receptacle.

In order to hold and define this locking position, the frame has a snap-action device opposite the pivoting device. The pivoting device can be brought into engagement with the snap-action device to fix the component to be tested. This has the advantage that it is possible to carry out the automatic quality and functional testing of the electronic component in a locking position without further measures being required for supplying and holding the component during individual preliminary tests of the test receptacle. An insert of this type may advantageously be constructed as a heat exchanger and cool or heat the component to be tested in the arresting position depending on test conditions.

The snap-action device may have a U-shaped pawl, with which a bar-type operating element of the pivoting device is in engagement in the locking position of the test device. In the event of locking, the bar-type operating element of the pivoting device engages into the U-shaped pawl of the snap-action device and the insert of the pivoting device presses onto the rear side of the component to be tested and thus presses the external contacts of the component onto the spring contacts of the test receptacle. This achieves reliable and secure contact-making and guarantees correspondingly reliable quality and functional testing.

A further embodiment of the invention provides for the test device to have four end pieces and two stacks comprising module components. In this case, each stack comprising module components forms a test receptacle half. In the test device, these two test receptacle halves are arranged opposite one another. In principle, it is also possible to prepare eight end pieces with correspondingly four stacks comprising module components, the stacks comprising module components in each case merely constituting a quarter of a test receptacle. In any event the four stacks are then placed opposite one another in a square and can thus test integrated circuit types having external contacts arranged in square fashion.

In the case of two stacks comprising module components, the test receptacle halves may be arranged opposite one another and be held in position on a baseplate by corresponding fitting screws led through the end pieces. This is associated with the advantage that the test device according to the invention with its modular design is extremely flexible and can be adapted to each different circuit type. Moreover, the number of module components and thus the number of external contacts of a component to be tested are not in any way limited or prescribed by this test device. Rather, the test device can be extended for a wide variety of circuit types with two contact elements up to thousands of contact elements. The end pieces, the centering bolts and/or the fitting screws are produced from a chromium-nickel steel since components made of such steels can be produced in an oxidation-resistant manner and with an accurate fit.

To summarize, the construction and the design of the test device proposed differ from present-day commercial test devices by virtue of its modularity and its short signal paths. In the case of the present invention, the receptacle is not produced from one casting; rather, it is subdivided into modules per external terminal or per external terminal pair. These modules can be varied as desired in terms of number and arrangement, be lined up together or placed opposite one another. The shorter signal paths resulting from additional adapter printed circuit boards being omitted result in reduced imaginary components in the line impedance with regard to inductance and capacitance. As a result of an adapter printed circuit board being omitted, higher supply currents are possible during use of the test devices, which may be more than 20 amperes.

BRIEF DESCRIPTION OF THE DRAWINGS

The invention will now be described in greater detail on the basis of embodiments with reference to the accompanying figures.

FIG. 2 shows a schematic perspective view of a component to be tested with a guide frame.

FIG. 3 shows a schematic exploded perspective view of a test receptacle of a second embodiment of the invention.

DETAILED DESCRIPTION

Figure 1:
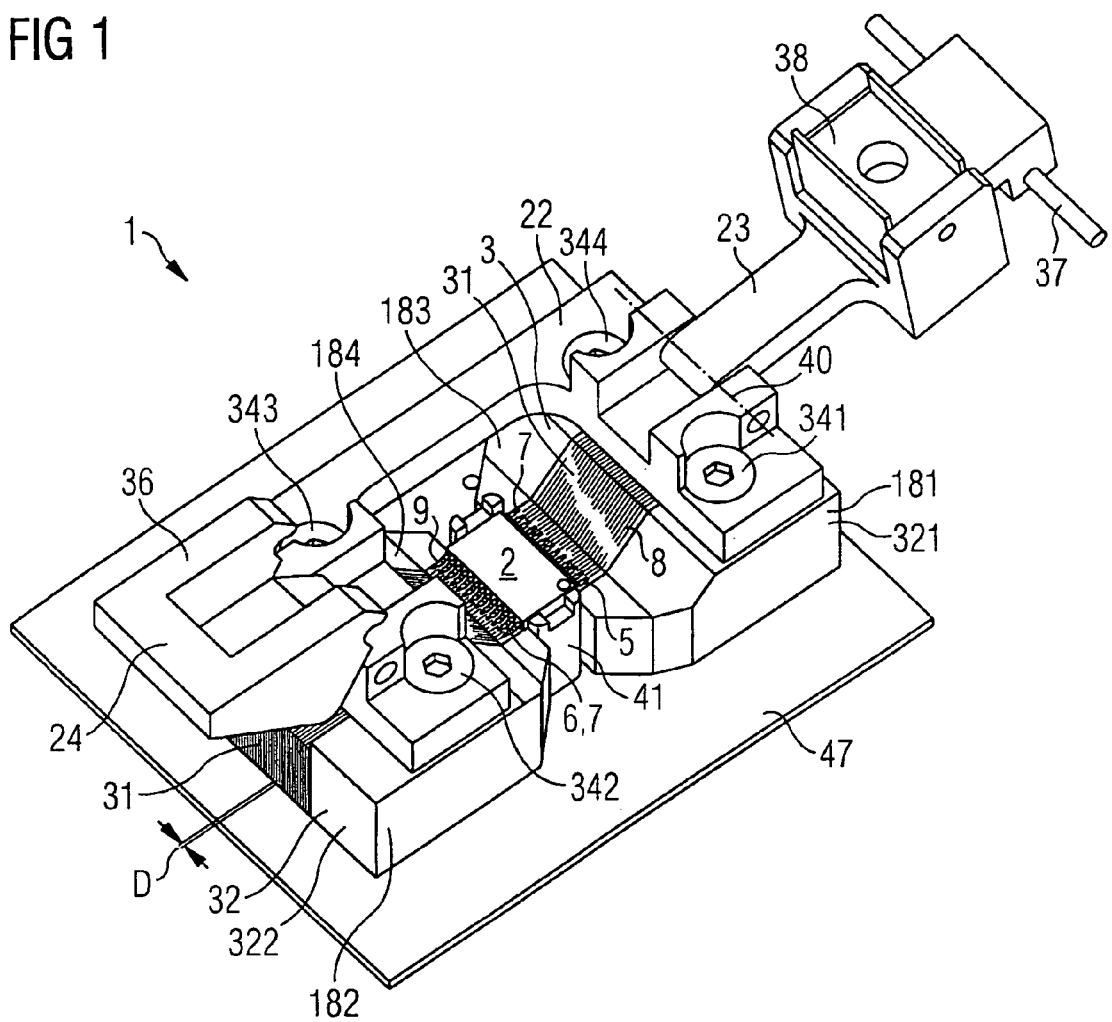
FIG. 1 shows a schematic perspective view of a test device of a first embodiment of the invention for individual tests and preliminary tests of a test receptacle.

FIG. 1 shows a schematic perspective view of a test device 1 of a first embodiment of the invention for individual tests and preliminary tests of a test receptacle. The reference symbol 2 denotes a component of an integrated circuit. The reference symbol 3 denotes the test receptacle, which comprises two test receptacles halves 321 and 322 in this embodiment of the invention. The reference symbol 5 denotes a multiplicity of spring contacts on the test receptacle 3 and the reference symbol 6 denotes the external contacts of the component of a circuit type that is to be tested. The reference symbol 7 denotes the individual external contact positions, in each of which a module component 8 is arranged. The reference symbol 18 denotes end pieces, this embodiment of the invention comprising four end pieces, namely 181, 182, 183 and 184, between which the module components 8 are arranged and inserted with an accurate fit.

The four end pieces 181, 182, 183 and 184 carry a frame 22, which is connected to the end pieces by four fitting screws 341, 342, 343 and 344, and which simultaneously fix the two receptacle halves 321 and 322 on a baseplate 33.

The reference symbol 23 denotes a pivoting device which can be pivoted about the axis 40 and has a bar-type operating element 37 by which the pivoting device 23 can be brought into engagement with a snap-action device 24 arranged opposite on the frame 22. The snap-action device 24 has a U-shaped pawl 36 into which the bar-type operating element 37 can latch.

The reference symbol 38 denotes an insert in the pivoting device 23, which, in a locking position of the pivoting device 23 with the snap-action device 24, presses the component 2 with its external contacts 6 onto the spring contacts 5 of the module components 8.

The frame 22, shown in FIG. 1, with the pivoting device 23 and the snap-action device 24 is required only for individual tests and also functional tests of a test receptacle 3 with specimen components 2 of different integrated circuit types. For the series test in an automatic test device, which carries out functional tests at a high throughput of integrated circuits at low temperatures down to −50° C. and at high temperatures up to 150° C., only the test receptacle is clamped into the automatic test device or the test receptacle is exchanged during a circuit type change, maintenance and repair work. The structures on the frame 22 are then no longer necessary.

The material thickness D of each of the module components 8 lies between approximately 0.3 mm and 1 mm, so that the test receptacle 3 or the test device 1 in this embodiment can accommodate a pitch for the external contacts of the electronic component of approximately 0.3 to 1 mm for testing. The modular design of this test device 1 makes it possible to adapt the number of spring contacts on the top side of the test receptacle and also the step size or the pitch of the contacts to the various components to be tested with different circuit types and to provide a broad range of test receptacles for different components. In this case, merely the number, material thickness and structure of the module components 8 are adapted to the circuit type of the respective component.

For testing, the component to be tested can be placed onto the test receptacle 3. The pivoting device is then pivoted about the axis 40, so that the insert 38 of the pivoting device can press onto the component 2, while the operating element 37 is brought into engagement with the snap-action device 24. In this case, the insert 38 may at the same time be formed as a heat conductor, with the result that it is possible to ensure intensive cooling or intensive heating of the component to be tested and of the test receptacle during the test phase.

On the other hand, special spring contacts may be provided in the module component, which spring contacts make contact with the rear side of the electronic component in order to test the insulation resistance of the component housing with respect to the external contacts. Finally, in this embodiment of the invention, the test device may be configured in such a way that an insulation resistance test block 41 is arranged between the two test receptacles halves 321 and 322, which makes contact with the rear side of the electronic component to be tested during the test phase.

FIG. 2 shows a schematic perspective view of a component to be tested with a guide frame. Components having functions identical to those in FIG. 1 are identified by the same reference symbols and are not discussed separately. This electronic component 2 of an integrated circuit has merely six external contacts 6. On account of the minimal size of this component, a guide frame 39 is provided, into which the electronic component 2 can be inserted in order to facilitate handling prior to testing. The guide frame 39 has two centering bolts 42 which can be introduced with an accurate fit into corresponding centering holes of the end pieces of a test receptacle.

FIG. 3 shows a schematic exploded perspective view of a test receptacle 3 of a second embodiment of the invention. Components having functions identical to those in FIGS. 1 and 2 are identified by the same reference symbols and are not discussed separately.

The test receptacle 3 is held together by two corner pieces 181 and 182. For this purpose, four centering bolts 17 project from the corner piece 181 and interact with fitting openings 16 of the module components 8 and ensure accurate positioning and stacking of the module components 8 on the corner piece 181. The second corner piece 182 has corresponding fitting openings 16 and can be pushed onto the centering bolts 17 of the corner piece 181 for assembly of the test receptacle 3.

In order to fix the two corner pieces with the module components 8 located in between or arranged in between, annular grooves are provided on the guide bolts 17 at their free-standing ends, over which annular grooves spreading spring washers can be pushed for arresting and fixing purposes after the stacking of module components 8 and second corner piece 182. In addition, the corner pieces 181 and 182 have centering holes 43 into which can be inserted, for the purpose of testing, the guide frame 39 with its centering bolts 42 in order to test the electronic component 2 held by the guide frame 39. In a manner, corresponding to the six external contacts 6 of the electronic component 2 that are arranged in pairs, three module components are provided for each of the three pairs of external contacts 6.

FIG. 3 illustrates three differently constructed module components 81, 82 and 83. For testing the electronic component 2, either three module components of the type 81 or three module components of the type 82 or three module components of the type 83 are used. With regard to the module component 81, only the main functional carriers of the module component are illustrated. These are firstly the spring contact tips 5, which are arranged from the module component in a manner adapted to the step size of the external contacts and the distance between two external contacts of an external contact pair of the component and project spring-elastically from the module component 81. Secondly, they are the square pins 49, which, as contact elements 4 of the underside of the test receptacle 3, are electrically connected to the spring contacts 5 of the top side of the test receptacle 3 and project rigidly downward from the module component 81 for insertion into the test board 47. And finally, with regard to the module component 81, the illustration identifies the position and size of the fitting openings 16 which interact with the centering bolts 17 of the end piece 181.

With regard to the module component 82 of FIG. 3, the illustration shows the connection between the rigid square pins 49 and the elastic spring contacts 5. This connection between the square pins 49 and the spring contacts 5 is essentially achieved by means of a contact plate 15, each of the square pins 49 being connected to such a contact plate 15, which comprises three sections, a holding section 14, which holds the square pin 49 and is connected to a spring section 13, the spring section 13 merging with a contact section 12 having the spring contact 5 at its free end. The spring section 13 brings about a spring force of the spring contacts 5 onto an external contact of an electronic component of about 38 to 50 g. For this purpose, use is made of a contact plate having a spring bronze, such as beryllium bronze.

While the holding section 14 is arranged with an accurate fit in a cutout of a carrier plate 8, for the spring section 13 a clearance fit is provided in the cutout of the carrier plate 10, with the result that the spring contact can yield resiliently between approximately 0.2 and 0.3 mm. In this embodiment of the module component 82, the spring section 13 of the contact plate 15 is formed as a spiral spring arc adjoined by a relatively stiff arm 44 carrying the spring contact 5. Two spring contacts 5 are provided for each of the external contacts 6 of the electronic component in order to enable secure contact-connection. The tip of the spring contact is coated with a noble metal such as gold in order to minimize the contact resistance and ensure that the spring contact neither erodes nor is oxidized. However, the spring contacts foul due to migration of the metals such as tin and lead of the external contacts to be tested.

The holding section 14 of the contact plate 15, which merges with the square pin 49 which projects from the carrier plate 10, is additionally secured against displacement by a fitting opening 25. An adapted projection 26 of the carrier plate projects into the fitting opening 25, thereby preventing displacement of the contact plate during insertion of the square pins 49 into corresponding plug sockets 20 of the test board 47. The thickness D of the module component 82 corresponds to the thickness D of the insulating carrier plate 10.

Figure 12:
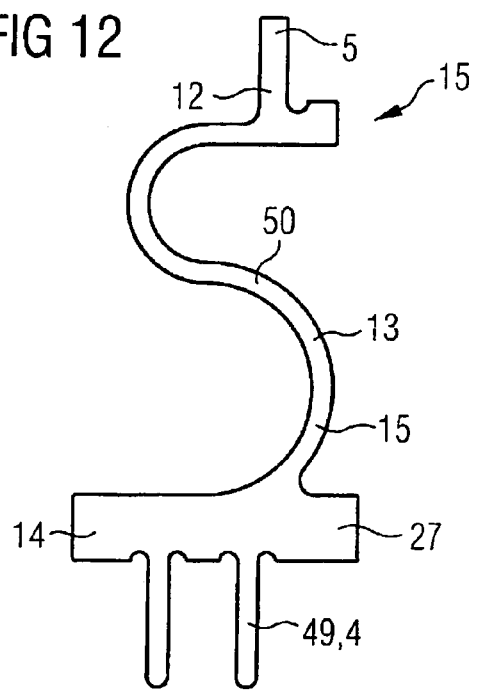
FIG. 12 shows a schematic side view of a contact plate.

A third embodiment of a module component 8 is shown with the module component 83, which has two further contact plates in addition to the contact plates of the module component 82 already explained. These contact plates provide for two additional spring contacts which, for example for insulation resistance measurement, can press against the bottom of the electronic component 2. The spring force of these central spring contacts 5 is applied by a spring clasp 30 in the spring section 13 of the contact plate 15. Instead of a spring clasp, it is also possible to use an S-shaped spring element 50, as is shown in FIG. 12.

Such a spring clasp has the advantage over a spiral arc 29 of a more compact design and can be equipped with a larger spring constant, with the result that a higher spring pressure is exerted on the underside of the electronic component to be tested. The contact plate 15 of this contact plate equipped with spring clasps 30 likewise has three sections, namely a contact section 12, the end of which forms the spring contact 5, a spring section 13 with the spring clasp 30, and a holding section 14, which fixes the contact element 4. During assembly of the individual module components 8 with the corner pieces 18 to form a test receptacle 3, the three module components 81, 82 and 83 can also be used in a mixed manner, depending on the requirement made of the test method. The contact elements 4 in the form of square pins 49 are arranged offset from module component 8 to module component 8, in order to ensure a sufficient dielectric strength between the contact elements. Accordingly, the plug sockets 35 on the test board 47 for receiving the assembled test receptacle 3 are arranged correspondingly offset.

Figure 4:
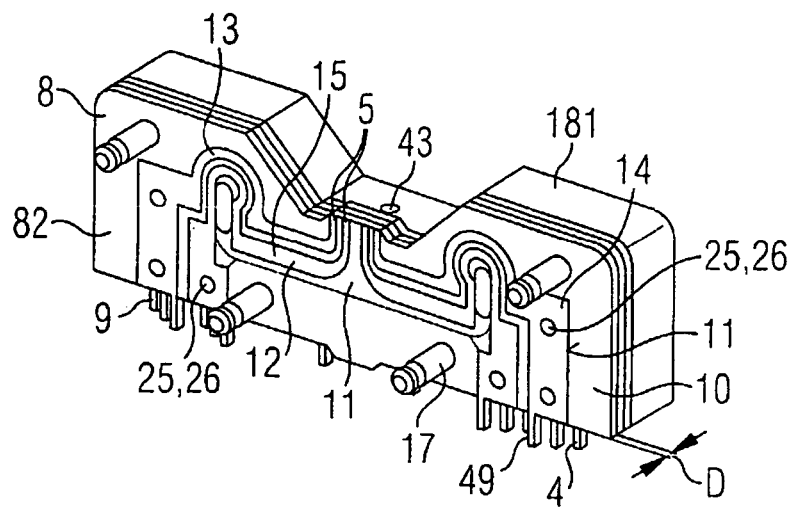
FIG. 4 shows a schematic perspective view of a partial assembly of the test receptacle of FIG. 3.

FIG. 4 shows a schematic perspective view of a partial assembly of the test receptacle of FIG. 3. Components having functions identical to those in the previous figures are identified by the same reference symbols and are not discussed separately.

Three module components 82 such as are shown in FIG. 3 have been assembled for the partially assembled test receptacle in FIG. 4. The difference between the individual module components merely consists in the fact that the square pins 49 are arranged offset from module component 8 to module component 8 in order to increase the dielectric strength. The three module components 82 are placed with an accurate fit onto the centering bolts 17 of the end piece 181 and form spring contacts 5 which are arranged in pairs and are adapted to the component 2 to be tested in terms of their number and their step size.

Figure 5:
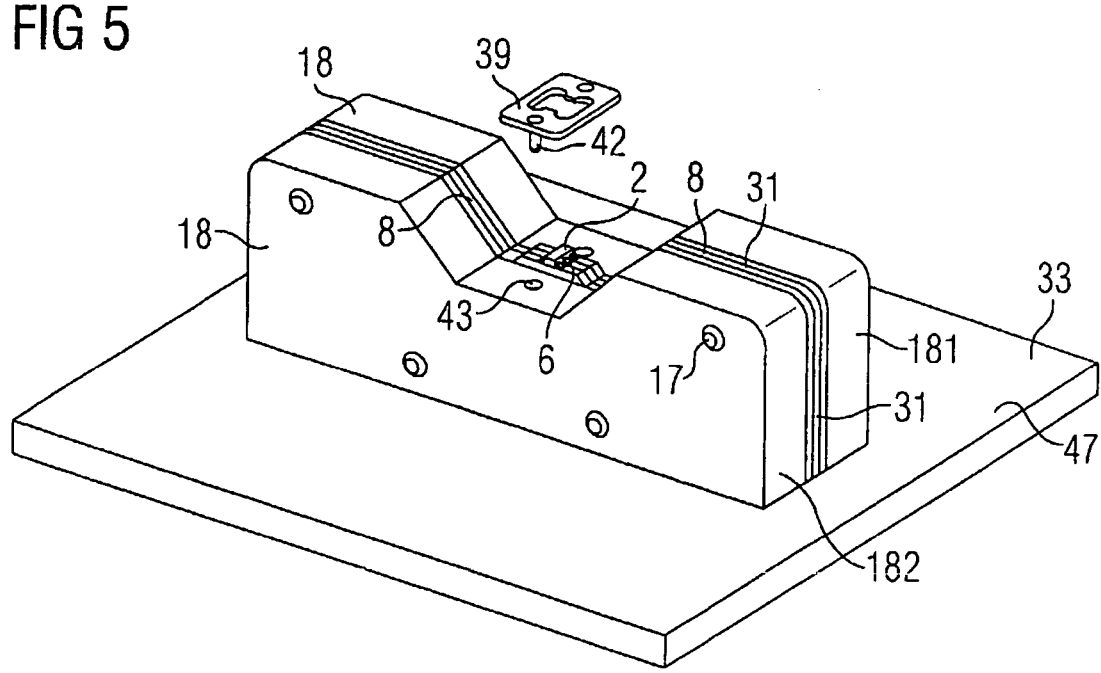
FIG. 5 shows the complete assembly of the test receptacle of FIG. 3.

FIG. 5 shows the complete assembly of the test receptacle 3 of FIG. 3. Components having functions identical to those in the previous figures are identified by the same reference symbols and are not discussed separately. By introducing or pressing on the contact elements 4 shown in FIGS. 3, 4, 6 to 14 into the plug sockets of the test board 47 or by pressing the contact elements onto wiring structures of the test board 47, the test receptacle is connected to conductor tracks of the test board 47 and corresponding test units can be connected to the test board 47.

Figure 6:
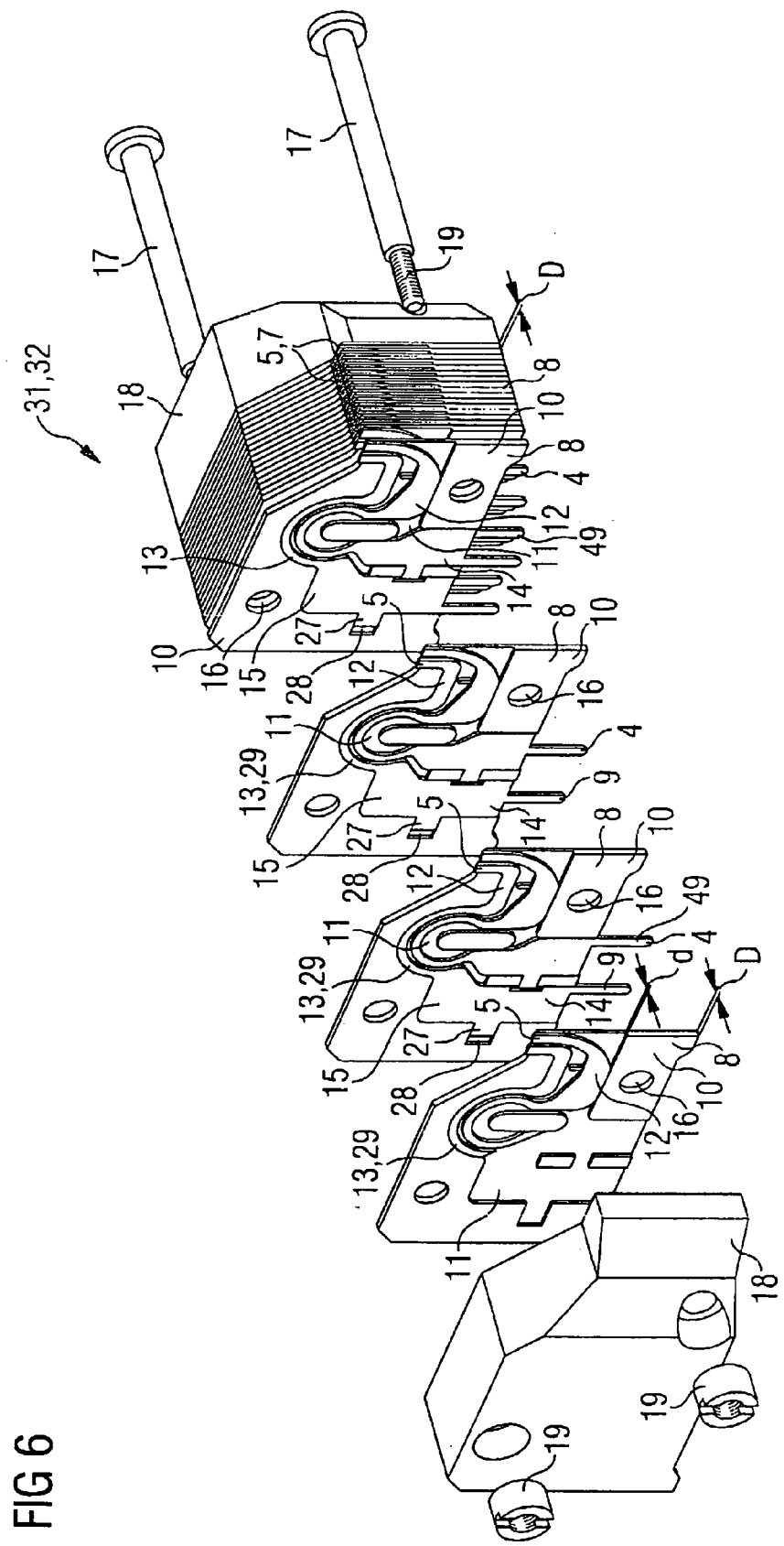
FIG. 6 shows a schematic exploded perspective view of a test receptacle half of a third embodiment of the invention.

FIG. 6 shows a schematic exploded perspective view of a test receptacle half 32 of a third embodiment of the invention. Components having functions identical to those in the previous figures are identified by the same reference symbols and are not discussed separately.

This test receptacle half has a total of twenty module components 8 which can be stacked and held together with the aid of the centering bolts 17 by screw connections 19.

The contact plate 15 is configured differently from the embodiment of FIG. 3 in the region of the holding section 14. Specifically, in this embodiment, the holding section 14 is not held by fitting openings in the holding section itself in the patterned cutout 11 of the insulating carrier plate 10, but rather by an arresting lug 27 of the holding section 14 which engages into an adapted cutout 28 of the carrier plate 10. The carrier plate 10 may be produced from polyimide, polyethylene, polypropylene, polytetrafluoroethylene and/or an epoxy resin, in which case a reinforcement by means of ceramic or glass fibers may be provided in order to increase its stability.

The spring section 13 of the contact plate is once again a spiral spring arc connected to the spring contact 5 via the rigid arm 44. The material thickness D of the carrier plate corresponds to the material thickness of the module components 8 and lies between approximately 0.3 and 1 mm. In the region of the patterned cutout 11, the carrier plate has been worked away to a material thickness of down to approximately 0.05 mm in order to accommodate the contact plate 15 in the cutout. The minimum material thickness in the region of the cutout of 0.05 mm is chosen so as still to ensure a reliable insulation from the adjacent contact plates by the carrier plate. The test receptacle half 32 with a stack 31 comprising module components 8 as shown in FIG. 6 may also be used as a test receptacle quarter for components which do not have external contacts only on two side edges but rather have external contacts on all four edges of the electronic component.

Figure 7:
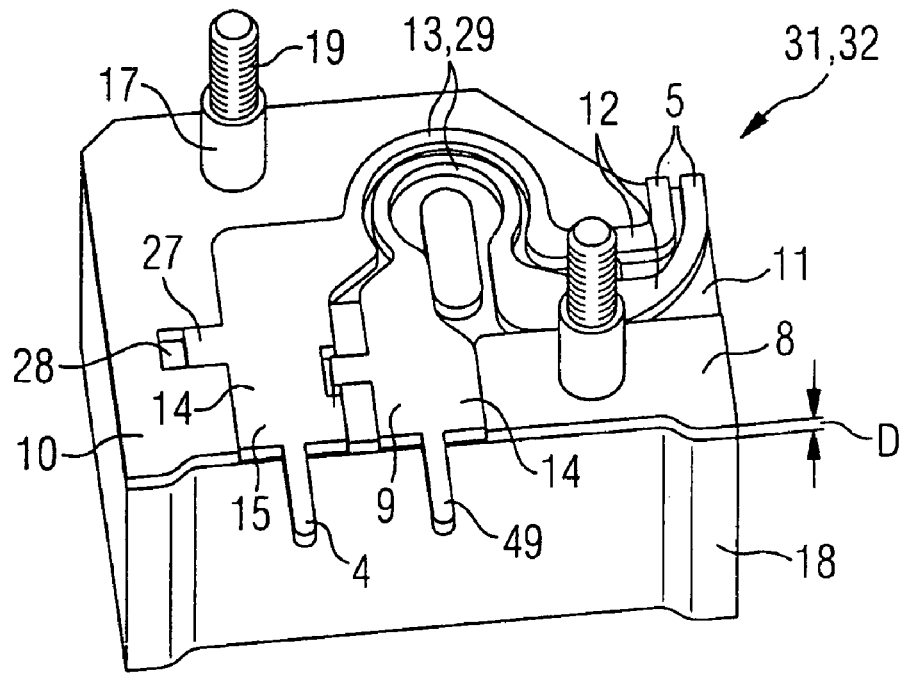
FIG. 7 shows a schematic perspective view of a test receptacle half with a view of the test pins of a module component placed on a corner piece.

FIG. 7 shows a schematic perspective view of a test receptacle half 32 with a view of the contact elements 4 of a module component 8 placed onto a corner piece 18. Components having functions identical to those in the previous figures are identified by the same reference symbols and are not discussed separately.

The corner piece 18 has two centering bolts 17 onto which the module component 8 can be plugged with an accurate fit. The contact elements 4 projecting from the module component are held by the holding section 14 and fixed against displacement by an arresting lug 27 which is arranged with an accurate fit in a cutout 28. While the holding section 14 is thus locally fixed, the spring section 13 comprising a spiral arc can be deformed on account of a corresponding clearance fit. This clearance fit of the spring section enables the outwardly projecting spring contact 5, onto which the external contact of the electronic component with an integrated circuit that is to be tested is to be placed, to yield spring-elastically. The residual material thickness d of the insulating carrier plate 10 of the module component 8 is greater than approximately 0.05 mm in the region of the patterned cutout 11.

Figure 8:
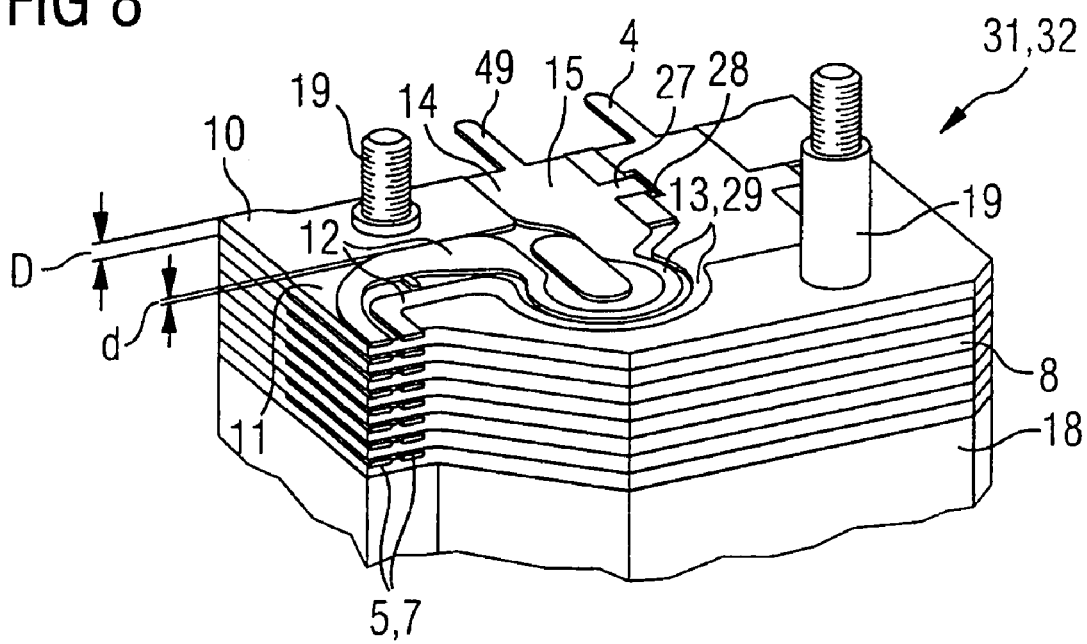
FIG. 8 shows a schematic perspective view of a corner piece of a test receptacle half with a view of the spring contacts of eight module components stacked one on the other.

FIG. 8 shows a schematic perspective view of an end piece 18 of a test receptacle half 32 with a view of the spring contact of eight module components 8 stacked one on the other. Components having functions identical to those in the previous figures are identified by identical reference symbols and are not discussed separately.

FIG. 8 shows a dense packing of module components and thus a dense packing of spring contacts 5 which project by approximately 0.2 to 0.3 mm from the respective module component. This projecting section corresponds to the clearance fit of the contact section and the spring section of the contact plate 15 in the cutout 11 of the insulating carrier plate 10. The holding section is formed and fixed by an arresting lug 27 in a similar manner to that in FIGS. 7 and 6. FIG. 8 shows the flexibility of the test receptacle according to the invention and demonstrates the stackability of the module components 8. The spring elements may be produced from spring bronze such as beryllium bronze, which has proven to be a reliable material for permanently elastic inserts. In order to ensure contact-making of the spring contacts 5, the surface of the spring contacts is provided with a noble metal coating in the region of contact with the external contacts of a component to be tested.

Figure 9:
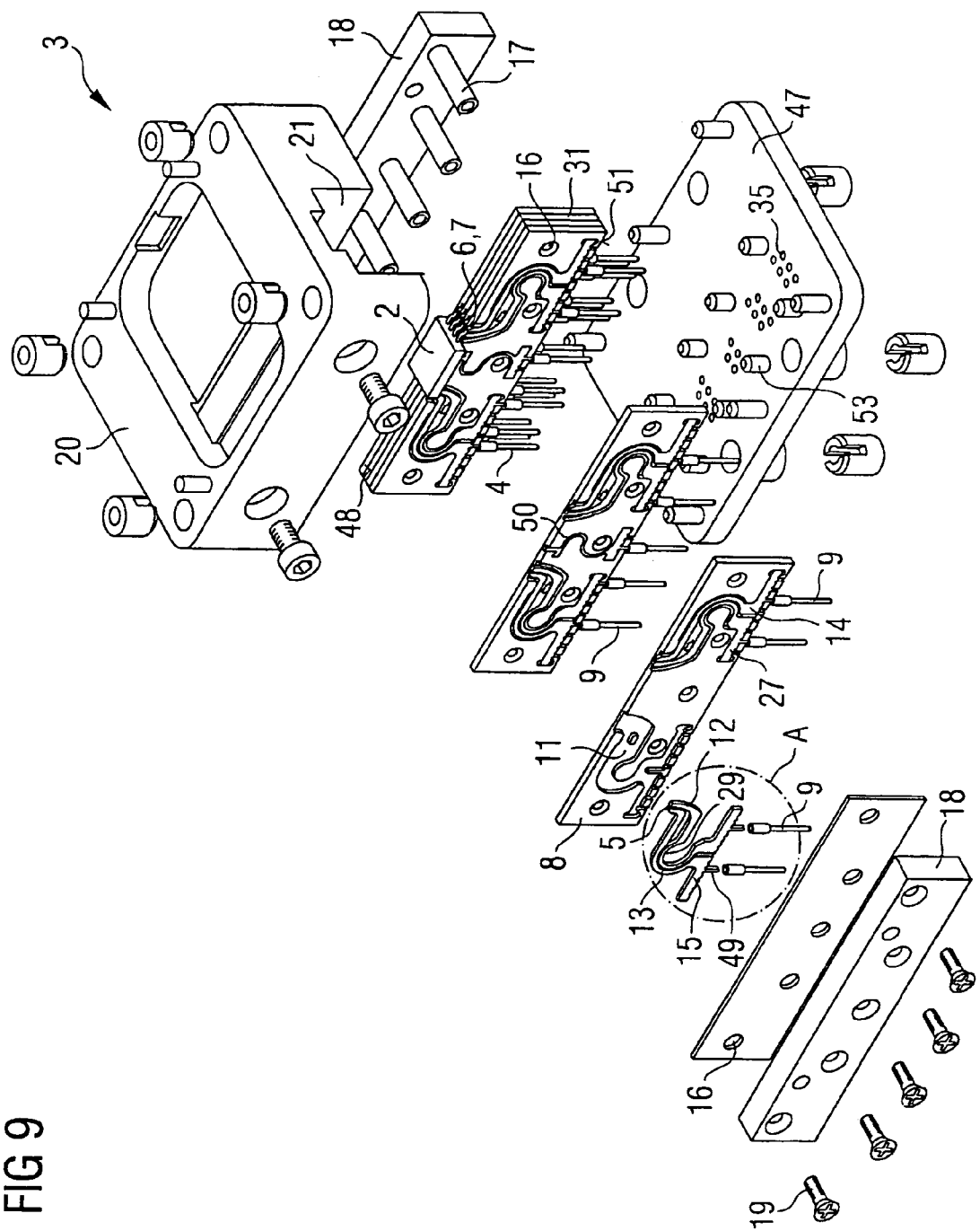
FIG. 9 shows a schematic perspective view of a test device of a fourth embodiment of the invention with a test receptacle for functional test series of components of integrated circuits.

FIG. 9 shows a schematic perspective view of a test device of a fourth embodiment of the invention with a test receptacle 3 for functional test series of components 2 of integrated circuits. Components having functions identical to those in the previous figures are identified by the same reference symbols and are not discussed separately.

The fourth embodiment of the invention differs from the first three embodiments of the invention by the fact that the two end pieces 18 which hold together the stack 31 comprising module components 8, in the assembled state, can be inserted into a housing frame 20 having a cutout 21 in the housing frame 20 for receiving the end pieces 18 with the module components 8.

A further difference consists in the external contour of the module components 8. Whereas the top side of the module component stack in the first three embodiments has a central depression in which a component to be tested can be positioned, this fourth embodiment of the invention provides for a smooth upper edge from which the spring contacts 5 project, so that an electronic component 2 to be tested is not to be inserted into a recess, but rather can simply be placed flat onto the test receptacle. This has the advantage that a fast change can be effected during the automatic positioning of the components to be tested during series functional testing and the test costs are thus reduced.

A further difference between this fourth embodiment of the invention and the preceding embodiments is that the test board 47 is arranged at a distance from the underside 51 of the stack 31 of module components, spacers 53 ensuring a defined spacing. This spacing between the underside of the test receptacle and the top side of the test board 47 ensures that the test receptacle 3, which is burdened with extreme temperatures during series tests in an automatic test device, is thermally decoupled from the test board. The square pins 49 such as are illustrated in the previous three embodiments are lengthened by test pins 9 for the fourth embodiment shown in FIG. 9, so that they can bridge the spacing resulting from the spacers 53, on the one hand, and can be inserted into the plug sockets 35 of the test board 47, on the other hand.

Figure 13:
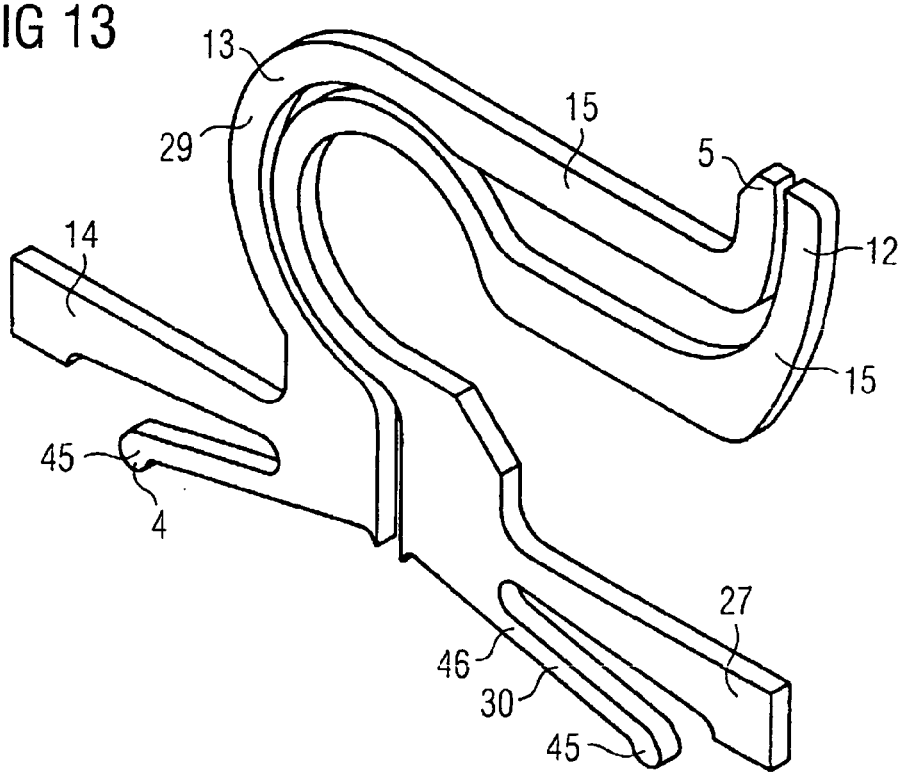
FIG. 13 shows a schematic perspective view of two contact plates for jointly contact-connecting and connecting an individual external contact of a component to contact springs on the underside of the test receptacle.
Figure 14:
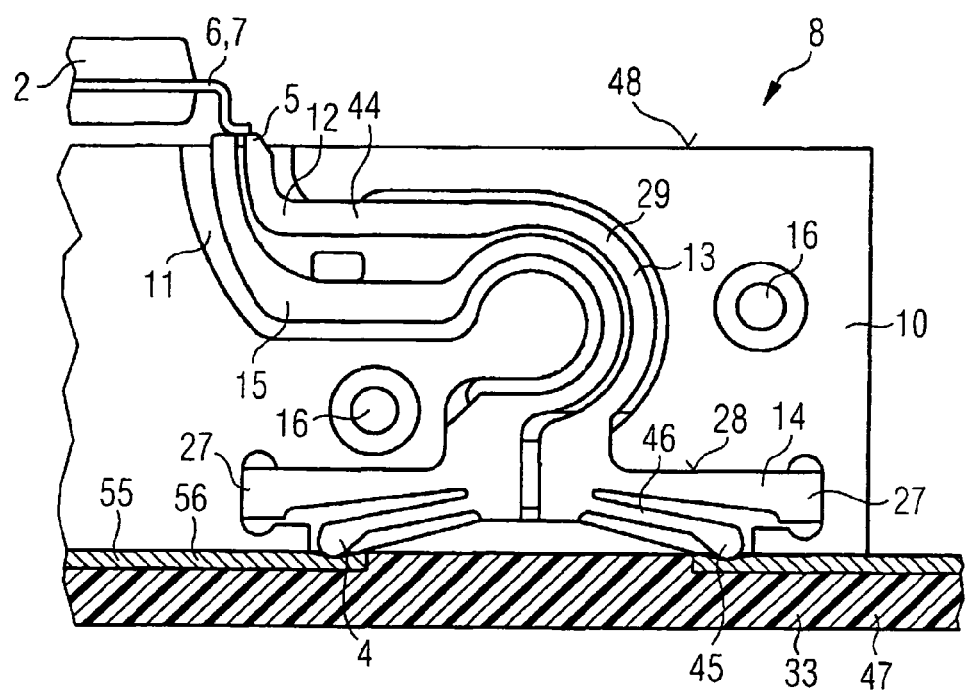
FIG. 14 shows a schematic side view of a part of a module component with contact plates such as are shown in FIG. 13 with contact springs to a test board.

Further details of this fourth embodiment of the invention are explained with the aid of FIGS. 10 to 14. These figures show, in particular, differences in the patterning and configuration of the contact plates 15 and the contact elements 4, which can either be embodied in rigid form as pins 9, as is shown in FIGS. 9 to 12, or as a contact spring 45, as is shown in FIGS. 13 and 14.

Figure 10:
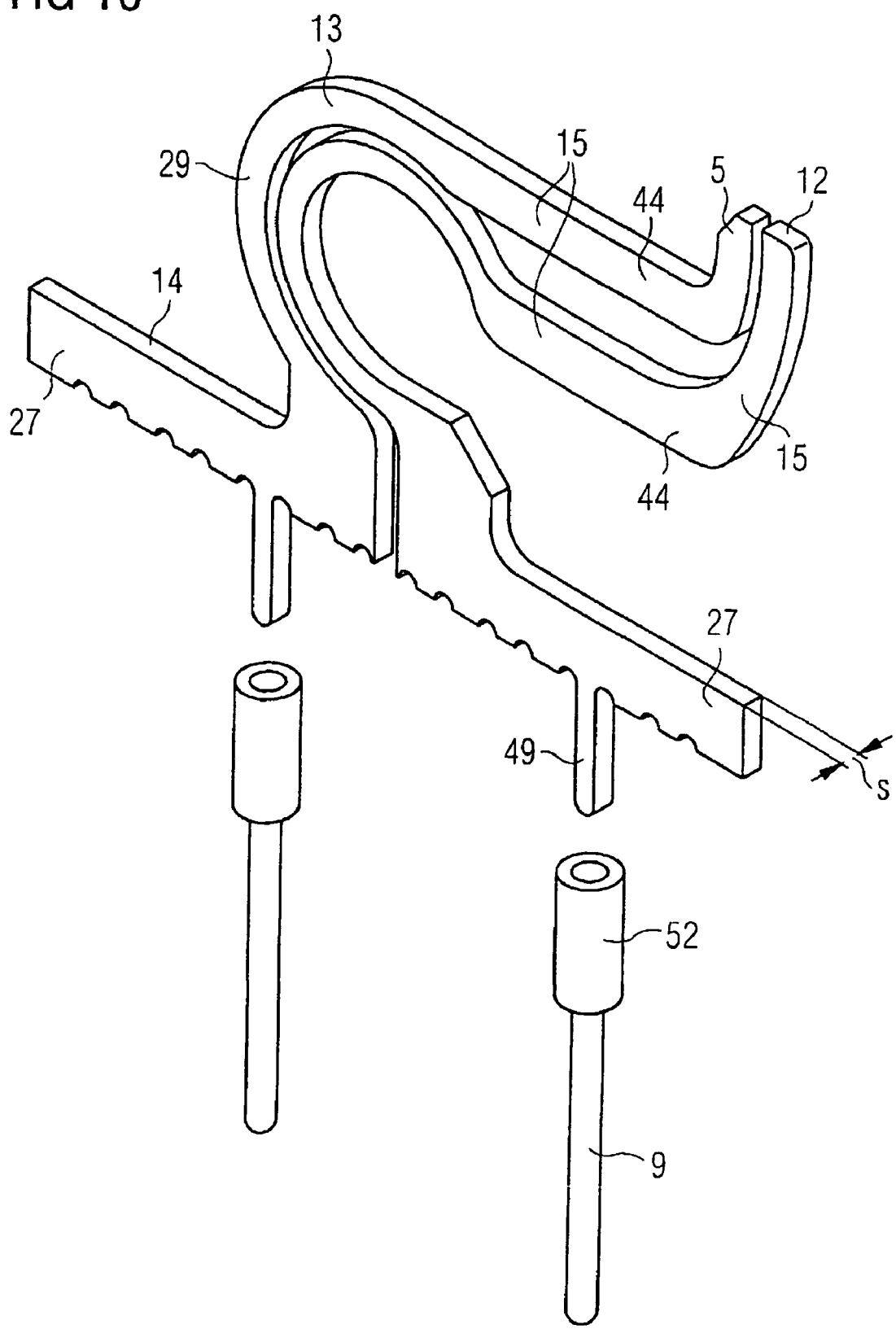
FIG. 10 shows a schematic perspective view of two contact plates with two spring contacts for jointly contact-connecting and connecting an individual external contact of a component to test pins on the underside of a test receptacle.

FIG. 10 shows a schematic perspective view of two contact plates with two spring contacts 5 for jointly contact-connecting and connecting an individual external contact of a component to test pins 9 on the underside of a test receptacle. Components having functions identical to those in the previous figures are identified by the same reference symbols and are not discussed separately.

In the case of this fourth embodiment of the invention, two contact plates 15 are fitted adjacent in such a way that they can simultaneously make contact with an external contact of an electronic component with their spring contacts 5. The spiral arc 29 of the spring section 13 is held in the holding section 14 by an arresting lug 27 arranged parallel to the lower edge of the test receptacle. The spring section 12, which is held in its orientation by the arresting lug 27, merges with a contact section 12, which has the spring contacts 5 toward the outside and has spring arms 44 within the cutout of an insulating plate, the spring arms having a larger cross section than the cross section of the spiral arc parts of the spring section. In the adapted cutout (not shown) of an insulating carrier plate, the arresting lug 27 forms the abutment for the spring section and at the same time it keeps the holding section ready, from which square pins 49 project from the underside of the test receptacle and have a quadrangular cross section. In order to lengthen these quadrangular cross sections, a cylindrical sleeve 52 is pressed onto the square pin 49 in a force-locking manner, so that the test pin 9 lengthens the rigid square pin 49 of the arresting lug 27.

In this embodiment of the invention, each arresting lug 27 may have seven square pins 49, in this embodiment according to FIG. 10 only one position of the possible seven positions being provided with a square pin 49, and the other six square pins are optionally removed.

Figure 11:
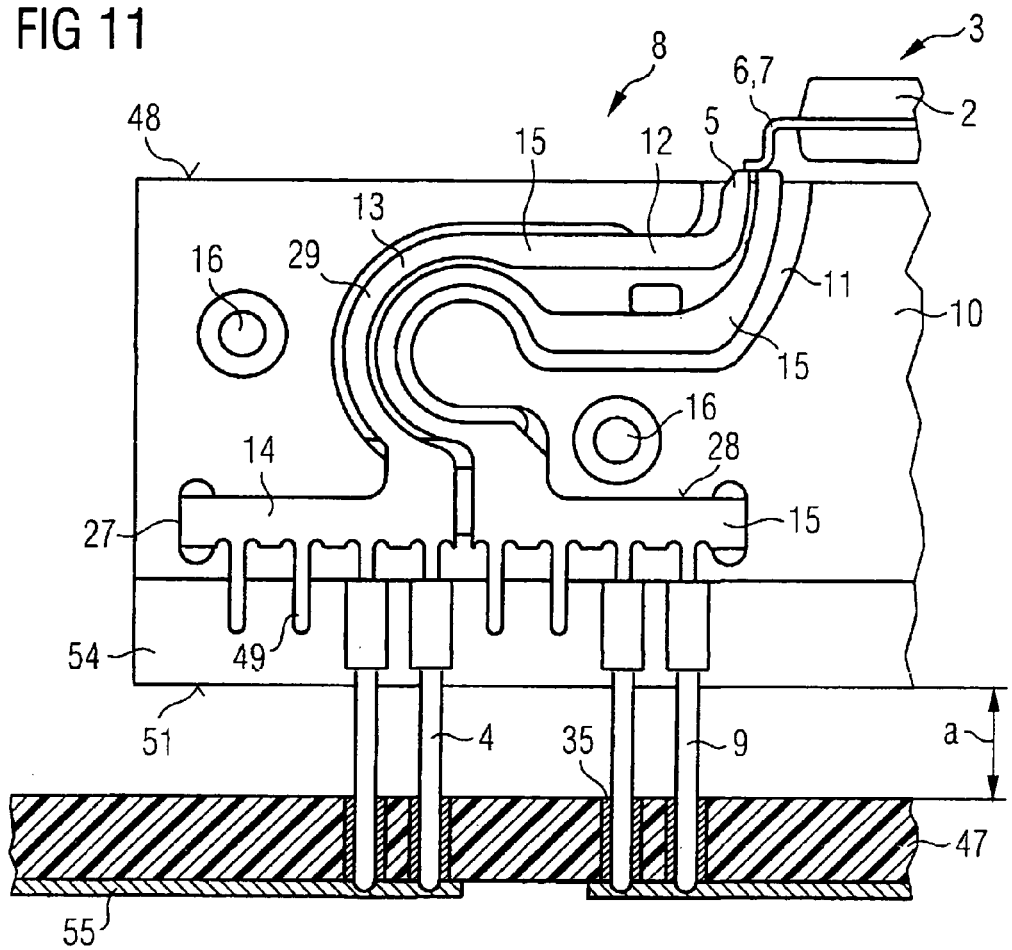
FIG. 11 shows a schematic side view of a part of a module component with contact plates such as are shown in FIG. 10 with test pins to a test board.

FIG. 11 shows a schematic side view of a part of a module component 8 with a contact plate 15 such as is shown in FIG. 10 with test pins 9 to a test board 47. Components having functions identical to those in the previous figures are identified by the same reference symbols and are not discussed separately.

This exemplary embodiment again provides two contact plates for an external contact 6 in an external contact position 7. In this case, the external contact 6 is provided with two spring contacts 5 of two mutually insulated contact plates 15, so that one of the contact plates provides a test signal, while the other contact plate checks whether the test signal is present at the external contact 6. Of the four square contacts 49 that are available for each contact plate of this exemplary embodiment, only two in each case are lengthened by test pins 9, so that they reach the test sockets 35 of the test board 47 at a distance a from the underside 51 of the test receptacle 3. The distance a serves for the thermal decoupling of test board and lower edge of plug-in receptacle. The underside of the test receptacle 51 may additionally have a thermal insulation layer made of Styropor, for example. Rewiring lines 55 of a rewiring structure may form the underside of the test board in order to route signals to the test pins 9.

FIG. 12 shows a schematic side view of a contact plate. Components having functions identical to those in the previous figure are identified by the same reference symbols and are not discussed separately.

The contact plate 15 has an S-shaped spring element as spring section 13. The S-shaped spring element can be produced more compactly than a spring clasp and is held in position in a cutout of an insulating carrier plate by an arresting lug 27. In this embodiment of the invention, the contact elements 4 are square pins 49 which can be inserted into a cylindrical sleeve of a test pin 9, which is shown in FIG. 10, and thus be lengthened. Such S-shaped spring elements are preferably used for the contact-connection of the underside of the electronic component to be tested in order thereby to establish the insulation resistance between the bottom region of an electronic component and the various external contacts. For this purpose, the S-shaped spring element presses with its spring contact 5 against the underside of the electronic component to be tested.

FIG. 13 shows a schematic perspective view of two contact plates 15 for jointly contact-connecting and connecting an individual external contact of a component to contact springs 45 on the underside of a test receptacle. Components having functions identical to those in the previous figures are identified by the same reference symbols and are not discussed separately.

The contact springs 45 project from the underside of a test receptacle and, in this embodiment of the invention, are formed as spreading springs 46 which extend from an arresting lug 27 of the holding section 14 of the contact plate 15. These contact springs 45 can be pressed directly onto a metal structure of a test board 47 for the contact-connection of a rewiring structure 56.

FIG. 14 shows a schematic side view of a part of a module component 8 with contact plates 15 such as are shown in FIG. 13 with contact springs 45 to a test board 47. Components having functions identical to those in the previous figures are identified by the same reference symbols and are not discussed separately.

This exemplary embodiment again provides two contact plates for an external contact 6 in an external contact position 7 of a component 2 to be tested. In this case, the external contact 6 is in contact with two spring contacts 5 of two mutually insulated contact plates 15, so that one of the contact plates provides a test signal, while the other contact plate checks whether the test signal is present at the external contact 6. Instead of the square contacts shown in FIG. 11, each of the contact plates 15 has a contact spring 45 which is pressed directly onto a rewiring line of a test board 47, with the result that the signal paths are shortened.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A test device for components of integrated circuits, comprising:
   a test receptacle comprising:
   contact elements that project from an underside of the test receptacle;
   spring contacts that project from a top side of the test receptacle opposite to the underside of the test receptacle, wherein the spring contacts are configured to be electrically contact-connected to external contacts of an integrated circuit type to be tested;
   a plurality of module components corresponding to external contact positions of the circuit type, each module component including at least one electrically conductive contact plate and an insulating carrier plate, the contact plate being arranged in a patterned cutout of the carrier plate, and the contact plate holding at least one contact section, a spring section and a holding section with at least one of the contact elements projecting from the underside of the test receptacle;
   wherein the plurality of module components for the integrated circuit type are assembled to form the test receptacle comprising at least one stack of module components, and the test device is selectively adjustable by combining module components in different stacked arrangements so as to facilitate testing of different integrated circuit types via the test device.

2. The test device according to claim 1, wherein the module component includes, for each external contact, two contact plates arranged in a manner insulated from one another in two cutouts with two spring contacts, which are connected to an individual external contact during testing.

3. The test device according to claim 1, wherein the at least one contact plate includes a spiral spring arc in the spring section of the contact plate.

4. The test device according to claim 1, wherein the at least one contact plate includes a spring clasp in the spring section of the contact plate.

5. The test device according to claim 1, wherein the at least one contact plate includes an S-shaped spring element in the spring section of the contact plate.

6. The test device according to claim 1, wherein the contact element projecting from the underside comprises at least one rigid test pin.

7. The test device according to claim 1, wherein the holding section has a plurality of rigid contact elements that project as square pins from the underside of the test receptacle and are shortened apart from one that is lengthened and connected to a cylindrical test pin in a force-locking manner.

8. The test device according to claim 1, wherein the contact elements of adjacent module components are arranged offset with respect to one another on the underside of the test receptacle.

9. The test device according to claim 1, further comprising a test board including a rewiring structure, wherein the contact elements are electrically connected to the rewiring structure via contact springs.

10. The test device according to claim 1, further comprising a test board including a rewiring structure, wherein the contact elements are connected via cylindrical test pins to the rewiring structure via plug sockets.

11. The test device according to claim 1, wherein each module component has a material thickness of between approximately 0.3 mm and 1 mm.

12. The test device according to claim 1, wherein each carrier plate has an overall material thickness of between approximately 0.3 mm and 1 mm and a minimum material thickness in the region of the cutouts for the at least one contact plate of at least approximately 0.05 mm.

13. The test device according to claim 1, wherein the contact plate has a material thickness of approximately 0.050 to 0.750 mm.

14. The test device according to claim 1, wherein the at least one contact plate includes, in the holding section, a fitting opening into which an adapted projection of the carrier plate engages.

15. The test device according to claim 1, wherein the at least one contact plate has, in the holding section, an arresting lug which engages into an adapted cutout of the carrier plate.

16. The test device according to claim 1, wherein the at least one contact plate has, in the contact section of the contact plate, a clearance fit with respect to the patterned cutout of the carrier plate of approximately 0.2 to 0.3 mm to permit a corresponding contact spring deflection of the contact section.

17. The test device according to claim 1, further comprising four end pieces, wherein the test device includes two stacks comprising module components, each stack comprising module components forming a test receptacle half, the two test receptacle halves being arranged opposite one another and being held in position on a baseplate by a respective fitting screw led through each end piece.

18. The test device according to claim 1, further comprising a test board including plug sockets for receiving the test pins of the module components.

19. The test device according to claim 1, wherein the carrier plate comprises polyimide, polyethylene, polypropylene or an epoxy resin.

20. The test device according to claim 1, wherein the contact plate comprises a spring bronze and, in the contact section has a coating made of a noble metal.

21. The test device according to claim 1, further comprising end pieces, centering bolts and/or fitting screws comprising a chromium-nickel steel.

22. The test device according to claim 1, wherein a thickness of at least two module components in the stack varies to accommodate a change in pitch between external contacts of different integrated circuit types to be tested by the test device.

23. The test device according to claim 1, wherein the contact element projecting from the underside comprises at least one contact spring.

24. The test device according to claim 23, wherein the contact spring is formed on the underside of the test receptacle as a spreading spring and is spread away spring-elastically from the holding section of the contact plate.

25. The test device according to claim 1, wherein each module component has at least two fitting openings through which lead centering bolts that connect two end pieces to one another, the end pieces and the centering bolts holding the module components together with an accurate fit in stacked fashion to form the test receptacle.

26. The test device according to claim 25, wherein centering bolts are connected to one of the end pieces and hold the second of the end pieces by screw connections.

27. The test device according to claim 25, wherein the end pieces, for individual preliminary tests of the test receptacle, carry a frame which includes a pivoting device configured to pivot onto a component to be tested with an integrated circuit with spring contact-making between the external contacts of the component to be tested and the spring contacts on the top side of the test receptacle.

28. The test device according to claim 27, wherein the pivoting device includes an insert adapted to the contour of the component to be tested and, in the locking position of the test device, presses the component with its external contacts onto the contact plate of the test receptacle.

29. The test device according to claim 27, wherein the frame for preliminary tests includes a snap-action device opposite the pivoting device and configured to engage the pivoting device to fix the component to be tested during preliminary tests.

30. The test device according to claim 29, wherein the snap-action device includes a U-shaped pawl configured to engage a bar-type operating element of the pivoting device in a locking position of the test device.

* * * * *